(12) United States Patent
Park et al.

(10) Patent No.: US 9,437,330 B2
(45) Date of Patent: Sep. 6, 2016

(54) MEMORY DEVICE AND MEMORY SYSTEM INCLUDE HARD REPAIR MODE AND SOFT REPAIR MODE

(71) Applicant: SK hynix Inc., Gyeonggi-do (KR)

(72) Inventors: Ga-Ram Park, Gyeonggi-do (KR); Jong-Yeol Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/571,047

(22) Filed: Dec. 15, 2014

(65) Prior Publication Data

US 2016/0078968 A1  Mar. 17, 2016

(30) Foreign Application Priority Data

Sep. 11, 2014  (KR) ........................ 10-2014-0120245

(51) Int. Cl.
| | | |
|---|---|---|
| G11C 17/00 | (2006.01) | |
| G11C 29/00 | (2006.01) | |
| G11C 17/16 | (2006.01) | |
| G11C 17/18 | (2006.01) | |
| G11C 7/20 | (2006.01) | |
| G11C 29/44 | (2006.01) | |
| G11C 29/04 | (2006.01) | |

(52) U.S. Cl.
CPC .................. G11C 29/78 (2013.01); G11C 7/20 (2013.01); G11C 17/16 (2013.01); G11C 17/18 (2013.01); G11C 29/4401 (2013.01); *G11C 2029/0409* (2013.01); *G11C 2029/4402* (2013.01)

(58) Field of Classification Search
CPC ........ G11C 29/78; G11C 17/18; G11C 17/16
USPC ............. 365/96, 225.7, 189.17, 233.13, 200, 365/201, 203, 204
See application file for complete search history.

(56) References Cited

U.S. PATENT DOCUMENTS

| | | | |
|---|---|---|---|
| 2007/0153595 A1* | 7/2007 | Martin ................. | G11C 17/165 365/200 |
| 2008/0091988 A1* | 4/2008 | Yoel ....................... | G11C 29/24 714/711 |
| 2013/0286759 A1* | 10/2013 | Park ........................ | G11C 8/10 365/201 |

FOREIGN PATENT DOCUMENTS

| | | |
|---|---|---|
| KR | 1020140036879 | 3/2014 |
| KR | 1020140139854 | 12/2014 |

* cited by examiner

*Primary Examiner* — Tha-O H Bui
(74) *Attorney, Agent, or Firm* — IP & T Group LLP (57) ABSTRACT

A memory device includes: a non-volatile memory circuit suitable for storing hard repair data; a data bus suitable for transmitting the hard repair data during a boot-up operation, and transmitting soft repair data during a soft repair mode; a plurality of registers suitable for storing repair data transmitted through the data bus and activated when the transmitted repair data is stored; a control circuit suitable for selecting a register to store the transmitted repair data among the plurality of the registers, and during the soft repair mode, deactivating a register that stores the same data as the transmitted repair data; and a memory bank suitable for performing a repair operation based on the data stored in a register that is activated among the plurality of the registers.

31 Claims, 7 Drawing Sheets

MEMORY DEVICE AND MEMORY SYSTEM INCLUDE HARD REPAIR MODE AND SOFT REPAIR MODE

CROSS-REFERENCE TO RELATED APPLICATIONS

The present application claims priority of Korean Patent Application No. 10-2014-0120245, filed on Sep. 11, 2014, which is incorporated herein by reference in its entirety.

BACKGROUND

1. Field

Exemplary embodiments of the present invention relate to a memory device and a memory system including the memory device.

2. Description of the Related Art

Figure 1:
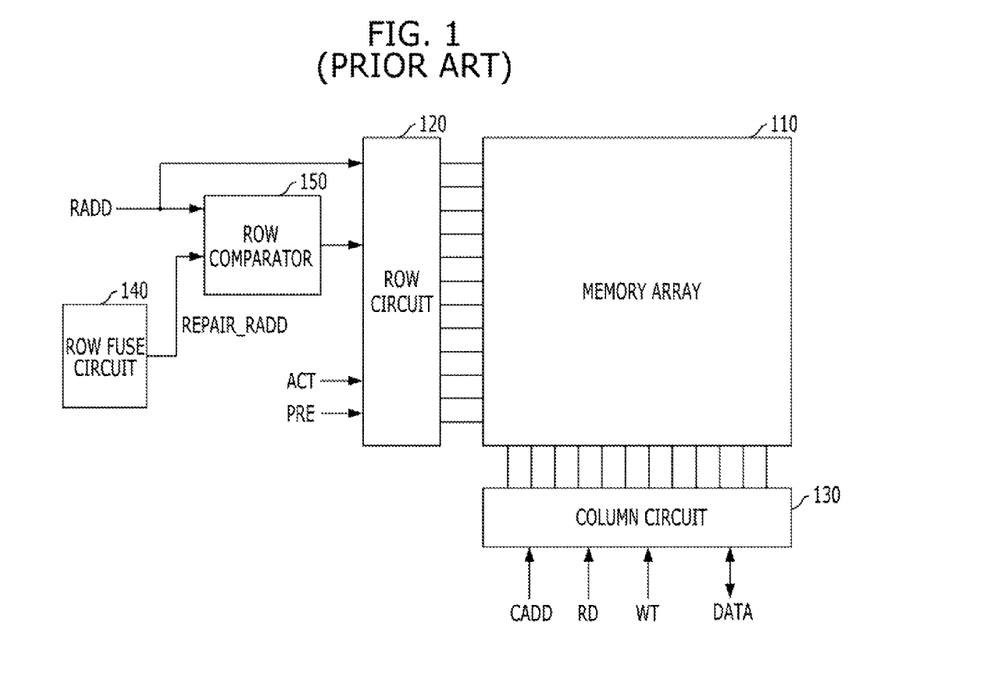
FIG. 1 is a block view illustrating a general memory device.

FIG. 1 is a block view illustrating a general memory device, such as a Dynamic Random Access Memory (DRAM) device.

FIG. 1 shows a single memory bank and related circuits in the memory device. Referring to FIG. 1, the memory device includes a memory array 110, a row circuit 120, and a column circuit 130. The memory array 110 includes a plurality of memory cells. The row circuit 120 activates a word line selected based on a row address RADD. The column circuit 130 accesses (i.e., reads or writes) data of a bit line selected based on a column address CADD.

A row fuse circuit 140 stores a repair row address REPAIR_RADD as a row address corresponding to a failed memory cell among the memory cells of the memory array 110. A row comparator 150 compares the repair row address REPAIR_RADD stored in the row fuse circuit 140 with the row address RADD inputted from outside of the memory device. If the repair row address REPAIR_RADD is the same as the row address RADD, the row comparator 150 controls the row circuit 120 to activate a redundancy word line instead of the word line designated by the row address RADD. In short, the row (word line) corresponding to the repair row address REPAIR_RADD stored in the row fuse circuit 140 is replaced with a redundancy row (word line).

An RACT signal is enabled in response to an active command, which activates a word line in the memory array 110, and is disabled in response to a precharge command, which deactivates a word line. Also, IRD refers to a read command, while IWR refers to a write command.

Generally, laser fuses are used in the row fuse circuit 140. The laser fuses store data of a logic 'high' level or a logic 'low' level depending on whether the fuses are cut. The laser fuses may be programmed in the wafer stage, but once the wafer is mounted in a package, it is not possible to program the laser fuses. Also, the laser fuses may not be designed in a small area due to pitch limitations.

To overcome these drawbacks, a non-volatile memory, such as an e-fuse array circuit, a NAND flash memory, a NOR flash memory, a Magnetic Random Access Memory (MRAM), a Spin Transfer Torque Magnetic Random Access Memory (STT-MRAM), a Resistive Random Access Memory (ReRAM), a Phase Change Random Access Memory (PC-MRAM) and the like is included in a memory device, and a repair data or a failure address is stored in the non-volatile memory.

Figure 2:
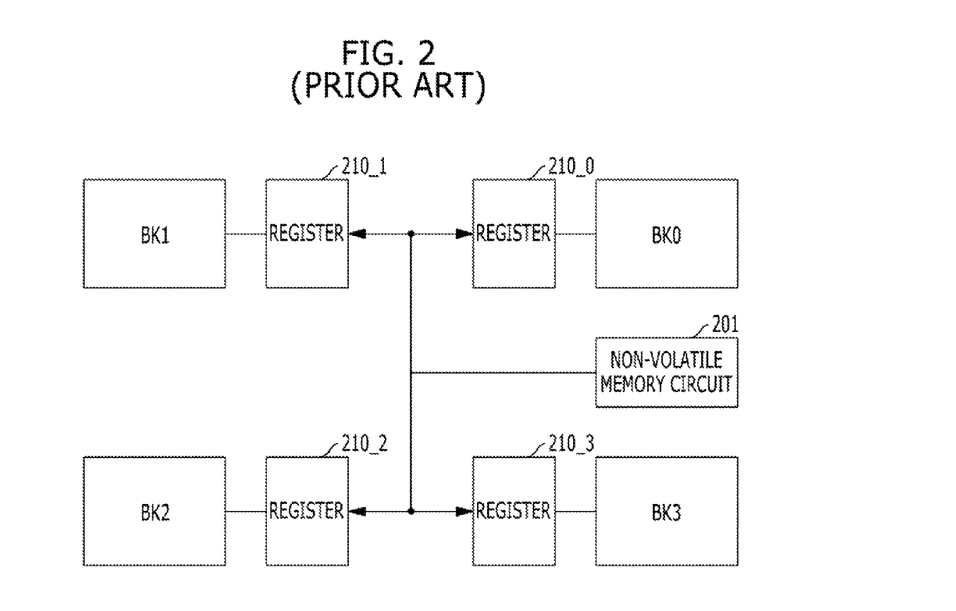
FIG. 2 is a block view illustrating a non-volatile memory circuit used to store repair data in a memory device.

FIG. 2 is a block view Illustrating a non-volatile memory circuit used to store repair data in a memory device.

Referring to FIG. 2, the memory device includes a plurality of memory banks BK0 to BK3, a non-volatile memory circuit 201, and registers 210_0 to 210_3 provided for the memory banks, respectively, and storing repair data.

The non-volatile memory circuit 201 substitutes the row fuse circuit 140. The non-volatile memory circuit 201 stores repair data, which are failed addresses, corresponding to all the memory banks BK0 to BK3. The non-volatile memory circuit 201 may be one selected from the group of non-volatile memories including an e-fuse array circuit, a NAND flash memory, a NOR flash memory, a Magnetic Random Access Memory (MRAM), a Spin Transfer Torque Magnetic Random Access Memory (STT-MRAM), a Resistive Random Access Memory (ReRAM), a Phase Change Random Access Memory (PC-MRAM) and the like.

Each of the registers 210_0 to 210_3 provided for the memory banks BK0 to BK3 stores the repair data of the memory bank corresponding thereto. For example, the register 210_0 stores the repair data of the memory bank BK0, and the register 210_2 stores the repair data of the memory bank BK2. The registers 210_0 to 210_3 are formed of latch circuits, and the registers 210_0 to 210_3 may store the repair data while power is supplied thereto. The repair data to be stored in the registers 210_0 to 210_3 are transmitted from the non-volatile memory circuit 201.

The repair data stored in the non-volatile memory circuit 201 are not directly used but are stored in the registers 210_0 to 210_3 and then used. This is because the non-volatile memory circuit 201 is formed in an array and thus it takes a predetermined time to read the data stored in the non-volatile memory circuit 201. Since the data stored in an array-type non-volatile memory circuit 201 may not be read instantly, it is impossible to perform a repair operation by directly using the data stored in the non-volatile memory circuit 201. Therefore, a boot-up operation where the repair data stored in the non-volatile memory circuit 201 are transmitted to and stored in the registers 210_0 to 210_3 is performed, and then after the boot-up operation, the repair operation is performed using the data stored in the registers 210_0 to 210_3.

When the row fuse circuit 140 formed of laser fuses is replaced by the non-volatile memory circuit 201 and the registers 210_0 to 210_3, it is possible to repair failures that are detected after the wafer stage. Meanwhile, researchers and industry are developing a technology for repairing failures detected after the fabrication of a memory device by accessing the non-volatile memory circuit 201 even after the fabrication of the memory device is completed (e.g., even after the product is sold).

SUMMARY

An embodiment of the present invention is directed to a memory device and a memory system capable of preventing an error that occurs when soft repair data is the same as hard repair data, by deactivating a register storing the hard repair data.

In accordance with an embodiment of the present invention, a memory device includes: a non-volatile memory circuit suitable for storing hard repair data; a data bus suitable for transmitting the hard repair data during a boot-up operation, and transmitting soft repair data during a soft repair mode; a plurality of registers suitable for storing repair data transmitted through the data bus and activated when the transmitted repair data is stored; a control circuit suitable for selecting a register to store the transmitted repair data among the plurality of the registers, and during the soft repair mode, deactivating a register that stores the same data as the transmitted repair data; and a memory bank suitable for performing a repair operation based on the data stored in a register that is activated among the plurality of the registers.

The control circuit may sequentially select the plurality of the registers during the boot-up operation, and during the soft repair mode, the control circuit may select a register that does not store data after the boot-up operation is completed.

The control circuit may compare the transmitted repair data with the data stored in the plurality of the registers during the soft repair mode, and the control circuit may compare an external address Inputted from an exterior of the memory device with the data stored in the plurality of the registers during the repair operation.

In the soft repair mode, the control circuit may deactivate a register storing the same data as the transmitted repair data in response to an active command, and the control circuit may store the transmitted repair data in a selected register among the plurality of the registers in response to a write command.

The non-volatile memory circuit may include one-time programmable memory cells in which data are not changed once the data are stored.

The data stored in the non-volatile memory circuit may be retained permanently, and the data stored in the plurality of the registers may be erased when the memory device is turned off.

The hard repair data may include memory hard repair data, which is repair data programmed when the memory device is fabricated, and system hard repair data, which is repair data transmitted from a memory controller to the memory device, and the soft repair data may be repair data transmitted from the memory controller to the memory device.

The plurality of the registers may include: one or more memory registers for storing the memory hard repair data; and one or more system registers for storing the system hard repair data or the soft repair data.

In accordance with another embodiment of the present Invention, a memory device includes: a non-volatile memory circuit including plural memory regions for storing memory hard repair data of plural memory banks and plural system regions for storing system hard repair data of the plural memory banks; a data bus suitable for transmitting the memory hard repair data and the system hard repair data during a boot-up operation, and transmitting soft repair data during a soft repair mode; plural registers suitable for storing data of a corresponding memory bank among the repair data transmitted through the data bus and activated when the transmitted repair data are stored; a control circuit suitable for selecting a register to store the transmitted repair data among the plural registers, and during the soft repair mode, deactivating a register that stores the same data as the transmitted repair data among the registers corresponding to a memory bank corresponding to the transmitted repair data; and plural memory banks suitable for performing a repair operation based on the data stored in activated registers.

The control circuit sequentially may select the plural registers during the boot-up operation and, during the soft repair mode, the control circuit may select a register that does not store data after the boot-up operation is completed among the registers corresponding to the transmitted repair data.

The control circuit may compare the transmitted repair data with the data stored in the registers corresponding to a memory bank corresponding to the transmitted repair data during the soft repair mode, and the control circuit may compare an external address inputted from an exterior of the memory device with the data stored in the registers corresponding to a memory bank designated by the inputted address during the repair operation.

The data stored in the non-volatile memory circuit may be retained permanently, and the data stored in the plural registers may be erased when the memory device is turned off.

The memory hard repair data may be repair data programmed when the memory device is fabricated, and the system hard repair data and the soft repair data may be repair data transmitted from a memory controller to the memory device.

The plural registers may include: one or more plural memory registers for storing the memory hard repair data; and one or more plural system registers for storing the system hard repair data or the soft repair data.

The non-volatile memory circuit may include one-time programmable memory cells in which data are not changed once the data are stored.

When a bank address and a normal address are inputted in a hard repair mode, the normal address may be programmed in a system region selected based on the bank address among the plural system regions, and when the bank address and the normal address are inputted in a soft repair mode, the normal address may be programmed in the registers corresponding to a memory bank designated by the bank address among the plural registers.

In accordance with yet another embodiment of the present invention, a memory system includes: a memory device that includes: a non-volatile memory circuit; plural memory banks, and the memory device programs system hard repair data inputted in a hard repair mode in the non-volatile memory circuit and performs a repair operation based on the repair data stored in the non-volatile memory circuit and soft repair data inputted in a soft repair mode; and a memory controller that sets up the memory device in the hard repair mode or the soft repair mode, inputs the system hard repair data into the memory device in the hard repair mode, and inputs the soft repair data into the memory device in the soft repair mode.

The memory device may further include: a data bus that may transmit memory hard repair data and the system hard repair data during a boot-up operation, and transmit the soft repair data during a soft repair mode; plural registers that may store data of a corresponding memory bank among the repair data transmitted through the data bus, the plural registers being activated when the transmitted repair data are stored; and a control circuit that may select a register to store the transmitted repair data among the plural registers, and deactivate a register storing the same data as the transmitted repair data among the registers corresponding to a memory bank corresponding to the transmitted repair data during the soft repair mode.

The memory device may perform repair operations of the plural memory banks based on the data stored in the activated register among the plural registers.

The memory hard repair data may be programmed when the memory device is fabricated.

The non-volatile memory circuit may include one-time programmable memory cells in which data are not changed once the data are stored.

The memory device may further include: a plurality of registers suitable for storing hard repair data including the system hard repair data and the soft repair data, wherein each of the plurality of registers is activated when one of the hard repair data and the soft repair data is stored therein; a control circuit suitable for controlling the plurality of registers to store the hard repair data during a boot-up operation, and to store the soft repair data in a soft repair mode, wherein the control circuit in the soft repair mode deactivates one or more hard repair registers of the plurality of registers storing the hard repair data, which is the same as the soft repair data; and a memory bank suitable for performing a repair operation based on the hard repair data and the soft repair data stored in activated registers of the plurality of the registers.

In the soft repair mode, the control circuit may control one or more soft repair registers of the plurality of registers, which are empty after the boot-up operation, to store the soft repair data.

In the soft repair mode, the control circuit may deactivate the hard repair registers in response to an active command, and may control the soft repair registers to store the soft repair data in response to a write command.

The plurality of the registers may be initialized when the memory device is turned off.

The hard repair data may be permanently stored in the memory system in fabrication, and the soft repair data may be temporarily stored in the memory device in operation.

In accordance with an embodiment of the present invention, a memory device may include: a plurality of registers suitable for storing a hard repair data and a soft repair data, wherein each of the plurality of registers is activated when one of the hard repair data and the soft repair data is stored therein; a control circuit suitable for controlling the plurality of registers to store the hard repair data during a boot-up operation, and to store the soft repair data in a soft repair mode, wherein the control circuit in the soft repair mode deactivates one or more hard repair registers of the plurality of registers storing the hard repair data, which is the same as the soft repair data; and a memory bank suitable for performing a repair operation based on the hard repair data and the soft repair data stored in activated ones of the plurality of the registers.

In the soft repair mode, the control circuit may control one or more soft repair registers of the plurality of registers, which are empty after the boot-up operation, to store the soft repair data.

In the soft repair mode, the control circuit may deactivate the hard repair registers in response to an active command, and may control the soft repair registers to store the soft repair data in response to a write command.

The plurality of the registers may be initialized when the memory device is turned off.

The hard repair data may be permanently stored in the memory system in fabrication, and the soft repair data may be temporarily stored in the memory device in operation.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereafter, definitions of a memory hard repair, a system hard repair, and a system soft repair are as follows.

Memory hard repair means a permanent repair performed in the middle of the fabrication process of a memory device.

System hard repair means a permanent repair performed after the memory device is packaged.

System soft repair means a temporary repair performed while power is supplied to the memory device after the memory device is packaged. Since the soft repair is maintained while power is supplied to the memory device, the soft repair is lost when the power supply to the memory device is cut off.

Figure 3:
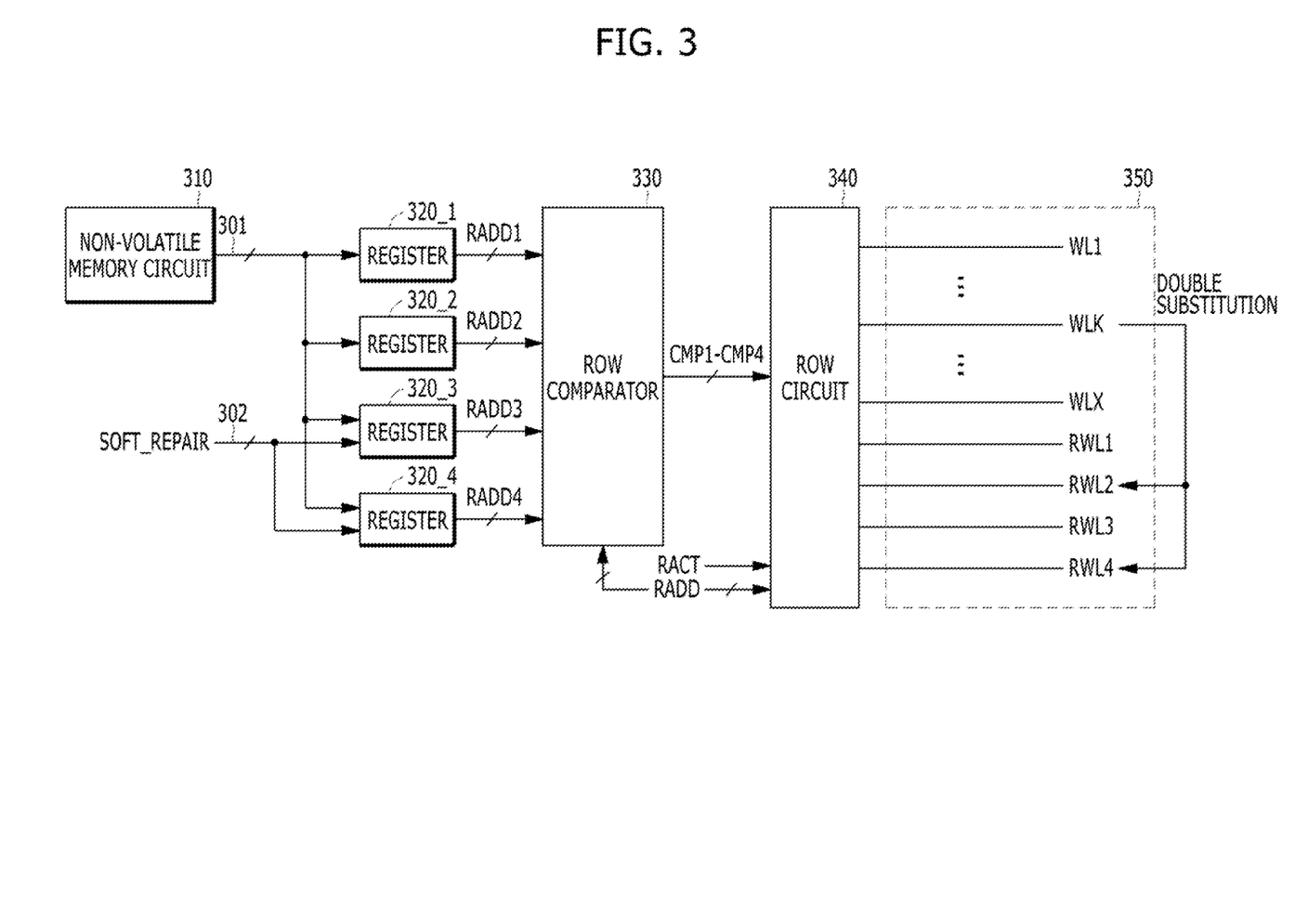
FIG. 3 shows a problem that may occur during a repair operation of a general memory device.

FIG. 3 shows a problem that may occur during a repair operation of a general memory device.

The memory device shown in FIG. 3 includes a non-volatile memory circuit 310, a plurality of registers 320_1 to 320_4, a row comparator 330, a row circuit 340, and a memory bank 350. The memory bank 350 includes a plurality of word lines WL1 to WLX and a plurality of redundancy word lines RWL1 to RWL4. A first transmission line 301 transmits data of the non-volatile memory circuit 310 to the registers 320_1 to 320_4, and a second transmission line 302 transmits soft repair data SOFT_REPAIR to the registers 320_1 to 320_4.

The row comparator 330 generates comparison signals CMP1 to CMP4 respectively corresponding to the registers 320_1 to 320_4 by comparing row addresses RADD1 to RADD4 stored in the registers 320_1 to 320_4 with a row address RADD inputted from outside of the memory device. When the row addresses RADD1 to RADD4 are the same as the row address RADD, the row comparator 330 enables the corresponding one of the comparison signals CMP1 to CMP4. The comparison signals CMP1 to CMP4 corresponds to redundancy word lines RWL1 to RWL4.

The row circuit 340 activates a word line corresponding to the row address RADD in response to an RACT signal, and when the comparison signals CMP1 to CMP4 are enabled, the redundancy word lines RWL1 to RWL4 corresponding to the enabled comparison signals are activated.

When a word line WLK is repaired through a memory hard repair or a system hard repair, the address of the word line WLK is programmed in the non-volatile memory circuit 310 and stored in the registers 320_1 to 320_4 through a boot-up operation. For example, it is assumed that repair data are stored in the registers 320_1 to 320_4 after the boot-up operation is completed and the address of the word line WLK may be stored in the register 320_2. When the address of the word line WLK is stored in the empty register 320_4 through a system soft repair, the following problems may occur.

When the row address RADD inputted for an active operation the address of the word line WLK, the row comparator 330 simultaneously enables the comparison signals CMP2 and CMP4 that correspond to the registers 320_2 and 320_4 storing the address of the word line WLK. Therefore, the row circuit 340 activates two redundancy word lines RWL2 and RWL4 simultaneously in response to the enabled comparison signals CMP2 and CMP4. When two word lines are simultaneously activated in one memory bank, the data of the memory cells (not shown in FIG. 3) coupled with the activated word lines may collide with each other.

Figure 4:
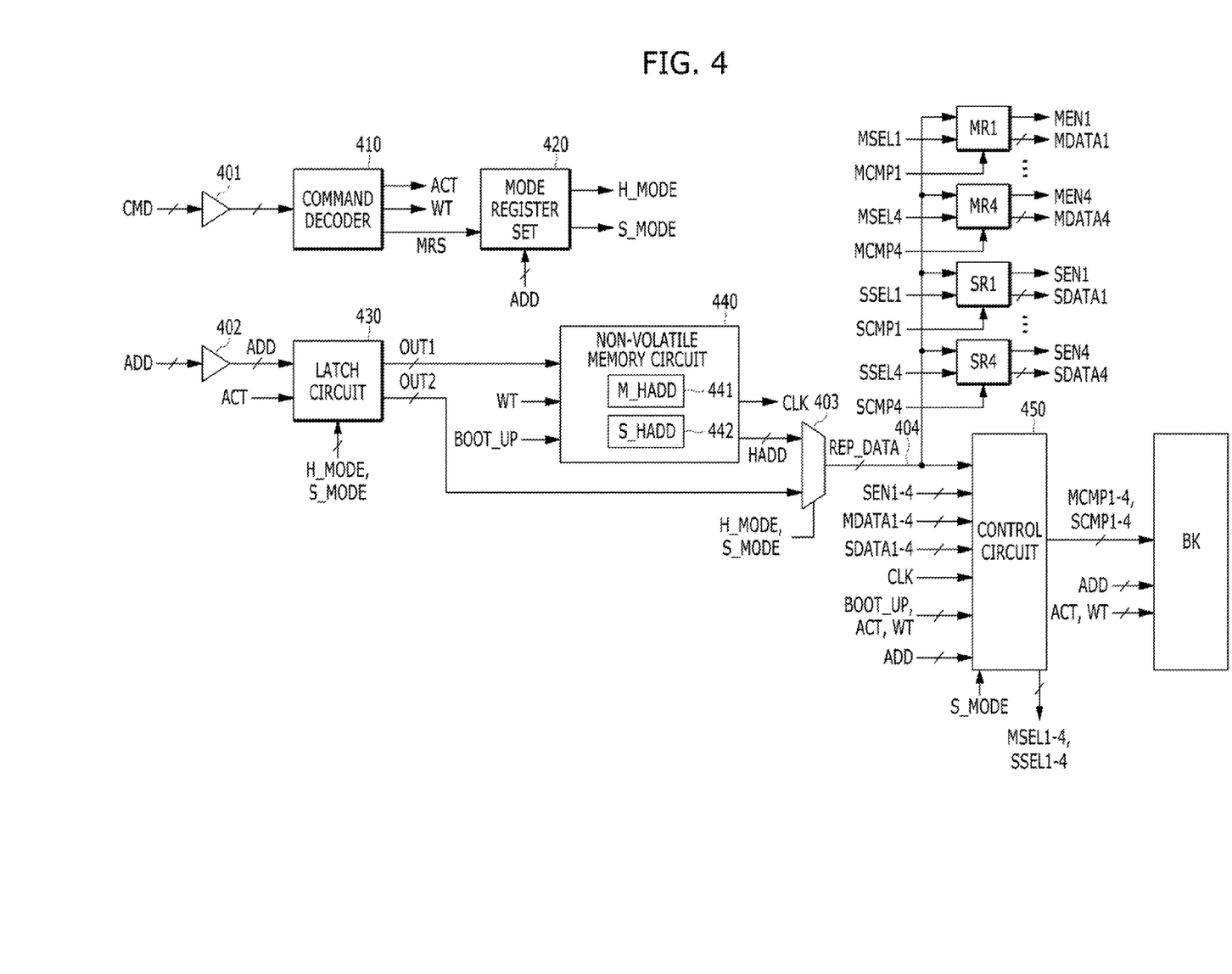
FIG. 4 is a block view illustrating a memory device in accordance with an embodiment of the present invention.

FIG. 4 is a block view illustrating a memory device in accordance with an embodiment of the present invention.

Referring to FIG. 4, the memory device may include a command receiver 401, an address receiver 402, a selector 403, a data bus 404, a command decoder 410, a mode register set 420, a latch circuit 430, a non-volatile memory circuit 440, a control circuit 450, a plurality of memory and system registers MR1 to MR4 and SR1 to SR4, and a memory bank BK.

The command receiver 401 may receive an external command CMD inputted from outside of the memory device. The command CMD may include a plurality of signals, including a Chip Selection signal CS, an active signal ACT, a Row Address Strobe signal RAS, a Column Address Strobe signal CAS, and a Write Enable signal WE.

The address receiver 402 may receive a normal input address ADD, which is a multi-bit signal inputted from outside of the memory device. The normal input address ADD may include a row address and a column address. The row address and the column address may be inputted through the same pad. An address inputted in synchronization with a row address strobe signal may be recognized as a row address in the memory device, and an address inputted in synchronization with a column address strobe signal may be recognized as a column address in the memory device.

The command decoder 410 may decode the command CMD received through the command receiver 401 and generate such internal commands as an active command ACT, a write command WT, and a mode register set command MRS. The command decoder 410 may enable a command corresponding to a combination of the signals that constitute the command CMD among the above internal commands ACT, WT and MRS. The command decoder 410 may receive not only the command CMD but also part of the normal input address ADD and use them for the decoding operation, and it may also use a combination of the commands CMD inputted, not from one cycle, but from a plurality of cycles, and use them for the decoding operation as well.

The mode register set 420 may set up a hard repair mode or a soft repair mode by using the normal input address ADD inputted through the address receiver 402 when the mode register set command MRS is enabled. Repair data may be programmed in the non-volatile memory circuit 440 in the hard repair mode for the memory hard repair or the system hard repair. Repair data may be stored in the registers SR1 to SR4 through the latch circuit 430 in the soft repair mode for the system soft repair. When the hard repair mode is set up, the mode register set 420 may enable a hard repair mode signal H_MODE for the memory hard repair or the system hard repair. When the soft repair mode is set up, the mode register set 420 may enable a soft repair mode signal S_MODE for the system soft repair.

The latch circuit 430 may latch and output the normal input address ADD inputted from outside of the memory device. When the active signal ACT is enabled, the latch circuit 430 may latch and output the normal input address ADD. The latch circuit 430 may output the normal input address ADD as a hard repair address OUT1 to the non-volatile memory circuit 440 in the hard repair mode, and output the normal input address ADD as a soft repair address OUT2 to the selector 403 in the soft repair mode.

The non-volatile memory circuit 440 may include a memory hard repair address region 441 for storing memory hard repair data M_HADD and a system hard repair address region 442 for storing system hard repair data S_HADD.

When the write command WT is enabled in the hard repair mode, the non-volatile memory circuit 440 receives the hard repair address signal OUT1 of the latch circuit 430 and may program it in the system hard repair region 442. The hard repair address signal OUT1 may be the system hard repair data S_HADD that is transmitted from outside of the memory device in the form of the normal input address ADD, that is, it may be a failure address representing a memory cell that needs to be repaired in the memory bank BK.

The memory hard repair data M_HADD may be programmed in the memory hard repair address region 441 of the non-volatile memory circuit 440 during the fabrication of the memory device.

When a boot-up signal BOOT_UP is enabled, the memory hard repair data M_HADD and the system hard repair data S_HADD stored in the non-volatile memory circuit 440 may be sequentially outputted as hard repair data HADD.

The non-volatile memory circuit 440 may be a non-volatile memory of diverse kinds such as an e-fuse array circuit, a NAND flash memory, a NOR flash memory, a Magnetic Random Access Memory (MRAM), a Spin Transfer Torque Magnetic Random Access Memory (STT-MRAM), a Resistive Random Access Memory (ReRAM), a Phase Change Random Access Memory (PC-MRAM) and the like. Generally, an e-fuse array circuit is used as the non-volatile memory circuit 440. The e-fuse array circuit includes a plurality of e-fuses that are arranged in the form of an array, and the e-fuses are used as memory cells. However, since it is impossible to program the e-fuses again after the e-fuses are programmed, the e-fuses are called one-time programmable memory cells.

Together with the failure address or the memory hard repair data M_HADD and the system hard repair data S_HADD, the non-volatile memory circuit 440 may also store an additional bit representing occupation of the failed address in the non-volatile memory circuit 440. The data may be transmitted to the register along with the failure address. In short, the data is included in the hard repair data HADD of the non-volatile memory circuit 440. As an example, it is assumed that the non-volatile memory circuit 440 is an e-fuse array including a plurality of fuse sets, each of which stores single failure address. Each of the fuse sets may be programmed with additional bit represents whether the failure address is programmed therein. The additional bit may be transmitted to the memory and system registers MR1 to MR4 and SR1 to SR4 along with the failure address stored in the corresponding fuse set.

The selector 403 may select and output one between the hard repair data HADD and the soft repair address OUT2 according to the hard repair mode signal H_MODE and the soft repair mode signal S_MODE. The selector 403 may select and output the hard repair data HADD, which is the memory hard repair data M_HADD and the system hard repair data S_HADD outputted from the non-volatile memory circuit 440 in the hard repair mode when the hard repair mode signal H_MODE is enabled, as a repair data REP_DATA. The selector 403 may select and output the soft repair address OUT2 of the latch circuit 430 as the repair data REP_DATA in the soft repair mode when the soft repair mode signal S_MODE is enabled. Therefore, the repair data REP_DATA may correspond to the memory hard repair data M_HADD and the system hard repair data S_HADD in the hard repair mode, and may correspond to the soft repair address OUT2 or soft repair data ADD in the soft repair mode.

The data bus 404 may transmit the repair data REP_DATA to the memory and system registers MR1 to MR4 and SR1 to SR4 and the control circuit 450. During the boot-up operation, the hard repair data M_HADD and S_HADD may be transmitted to the memory and system registers MR1 to MR4 and SR1 to SR4 and the control circuit 450 through the data bus 404. Also, in the soft repair mode, the soft repair data ADD may be transmitted to the memory and system registers MR1 to MR4 and SR1 to SR4 and the control circuit 450 through the data bus 404.

The memory and system registers MR1 to MR4 and SR1 to SR4 may include one or more memory registers MR1 to MR4 and one or more system registers SR1 to SR4. The one or more memory registers MR1 to MR4 may store the memory hard repair data M_HADD transmitted through the data bus 404, and the one or more system registers SR1 to SR4 may store the system hard repair data S_HADD and the soft repair data ADD transmitted through the data bus 404.

When the memory and system registers MR1 to MR4 and SR1 to SR4 are empty, they may be deactivated. When the memory and system registers MR1 to MR4 and SR1 to SR4 store the repair data including the memory hard repair data M_HADD, the system hard repair data S_HADD and the soft repair data ADD, they may activate memory and system enable signals MEN1 to MEN4 and SEN1 to SEN4 corresponding to activated ones of the memory and system registers MR1 to MR4 and SR1 to SR4. The memory and system enable signals MEN1 to MEN4 and SEN1 to SEN4 may be enabled based on an additional bit included in the hard repair data HADD and the soft repair data ADD. In the former case, the additional bit may be the additional bit representing occupation of the failed address in the non-volatile memory circuit 440. In the latter case, the additional bit may be generated by the control circuit 450 or may be inputted from outside to activate one of the system registers SR1 to SR4 storing the soft repair data ADD. In other words, the memory and system enable signals MEN1 to MEN4 and SEN1 to SEN4 may be enabled when the hard repair data HADD and the soft repair data ADD is stored in the corresponding one of the memory and system registers MR1 to MR4 and SR1 to SR4, and otherwise, the memory and system enable signals MEN1 to MEN4 and SEN1 to SEN4 may be disabled.

During the boot-up operation, the control circuit 450 may sequentially select the memory and system registers MR1 to MR4 and SR1 to SR4. In the soft repair mode after completion of the boot-up operation, the control circuit 450 may select one of the system registers SR1 to SR4 that is empty. The repair data REP_DATA transmitted through the data bus 404 may be stored in the memory and system registers MR1 to MR4 and SR1 to SR4 selected by the control circuit 450 during the boot-up operation and in the soft repair mode.

The control circuit 450 may deactivate one of the memory registers MR1 to MR4 storing the same data as the repair data REP_DATA in the soft repair mode. To this end, in the soft repair mode, the control circuit 450 may generate a plurality of memory and system comparison signals MCMP1 to MCMP4 and SCMP1 to SCMP4 by comparing the repair data REP_DATA with the data MDATA1 to MDATA4 and SDATA1 to SDATA4 of the memory and system registers MR1 to MR4 and SR1 to SR4. Also, the control circuit 450 may control repair operations in normal mode to access a redundancy cell that substitutes the failed cell corresponding to the normal input address ADD. To this end, during repair operations in the normal mode, the control circuit 450 may generate the memory and system comparison signals MCMP1 to MCMP4 and SCMP1 to SCMP4 by comparing the normal input address ADD with the data MDATA1 to MDATA4 and SDATA1 to SDATA4 of the memory and system registers MR1 to MR4 and SR1 to SR4.

To be specific, the control circuit 450 may generate memory and system selection signals MSEL1 to MSEL4 and SSEL1 to SSEL4 corresponding to the memory and system registers MR1 to MR4 and SR1 to SR4. During the boot-up operation, the control circuit 450 may sequentially enable the memory and system selection signals MSEL1 to MSEL4 and SSEL1 to SSEL4 from the selection signal MSEL1. Also, in the soft repair mode, the control circuit 450 may enable one among the system selection signals SSEL1 to SSEL4 corresponding to one of the system registers SR1 to SR4 that is empty. As described above, the memory and system enable signals MEN1 to MEN4 and SEN1 to SEN4 may be enabled when the hard repair data HADD and the soft repair data ADD is stored in the corresponding one of the memory and system registers MR1 to MR4 and SR1 to SR4, and otherwise, the memory and system enable signals MEN1 to MEN4 and SEN1 to SEN4 may be disabled.

In the soft repair mode, when the active command ACT is enabled, the control circuit 450 may enable one among the memory comparison signals MCMP1 to MCMP4 corresponding to one of the memory registers MR1 to MR4 storing the same data as the repair data REP_DATA through a comparison operation of the repair data REP_DATA with the data MDATA1 to MDATA4 of the memory registers MR1 to MR4. One of the memory registers MR1 to MR4 corresponding to the enabled one of the memory comparison signals MCMP1 to MCMP4 may be deactivated.

During the repair operation in the normal mode, the control circuit 450 may enable one among the memory and system comparison signals MCMP1 to MCMP4 and SCMP1 to SCMP4 corresponding to one of the memory and system registers MR1 to MR4 and SR1 to SR4 that stores the same data as the normal input address ADD. The memory and system comparison signals MCMP1 to MCMP4 and SCMP1 to SCMP4 may be inputted into the memory bank BK.

The memory bank BK may receive the memory and system comparison signals MCMP1 to MCMP4 and SCMP1 to SCMP4 and perform the repair operation in the normal mode. To be specific, the memory bank BK may access memory cells corresponding to the normal input address ADD and, when the memory and system comparison signals MCMP1 to MCMP4 and SCMP1 to SCMP4 are enabled, the memory bank BK may access redundancy cells designated by the enabled one of the memory and system comparison signals MCMP1 to MCMP4 and SCMP1 to SCMP4.

The boot-up operation is performed in response to a boot-up signal BOOT_UP, which is enabled automatically after the memory device is powered up or enabled under the control of a memory controller.

Hereafter, the hard repair mode, the boot-up operation, and the soft repair mode of the memory device are described based on what is described above.

First, the memory device may be set to the hard repair mode based on a normal input address ADD inputted together with a mode register set command MRS. In the hard repair mode, when the active command ACT is inputted, the normal input address ADD may be latched by the latch circuit 430 and inputted to the non-volatile memory circuit 440 as the hard repair address OUT1. When the write command WT is inputted, the hard repair address OUT1 inputted into the non-volatile memory circuit 440 may be programmed as the memory hard repair data M_HADD or the system hard repair data S_HADD.

Subsequently, during the boot-up operation or when the hard repair mode of the memory device ends and then the boot-up signal BOOT_UP is enabled, the hard repair data M_HADD and S_HADD stored in the non-volatile memory circuit 440 may be sequentially transmitted to and stored in the memory and system registers MR1 to MR4 and SR1 to SR4 as the repair data REP_DATA. The hard repair data M_HADD and S_HADD or the repair data REP_DATA stored in the memory and system registers MR1 to MR4 and SR1 to SR4 during the boot-up operation may be the data MDATA1 to MDATA4 and SDATA1 to SDATA4 of the memory and system registers MR1 to MR4 and SR1 to SR4. The memory and system enable signals MEN1 to MEN4 and SEN1 to SEN4 corresponding to the memory and system registers MR1 to MR4 and SR1 to SR4 storing the hard repair data M_HADD and S_HADD or the repair address may be enabled.

Subsequently, the memory device may be set to a soft repair mode based on the normal input address ADD inputted together with the mode register set command MRS. In the soft repair mode, when the active command ACT is inputted, the normal input address ADD is latched by the latch circuit 430 and transmitted to the system registers SR1 to SR4 as the soft repair address OUT2 and the repair data REP_DATA.

In the soft repair mode, the control circuit 450 may compare the repair data REP_DATA, which represents the soft repair address OUT2 or the normal input address ADD inputted in the soft repair mode, with the data MDATA1 to MDATA4 and SDATA1 to SDATA4 stored in the memory and system registers MR1 to MR4 and SR1 to SR4.

In the soft repair mode, the control circuit 450 may enable one among the memory comparison signals MCMP1 to MCMP4 for the memory registers MR1 to MR4 when the corresponding one among the data MDATA1 to MDATA4 of the memory registers MR1 to MR4 is the same data as the repair data REP_DATA. For example, the control circuit 450 may enable the first memory comparison signal MCMP1 for the first memory register MR1, when the first data MDATA1 stored in the first memory register MR1 is the same data as the repair data REP_DATA.

The memory registers MR1 to MR4 may disable the corresponding one among the memory enable signals MEN1 to MEN4 according to the enablement of the corresponding one of the memory comparison signals MCMP1 to MCMP4 for the memory registers MR1 to MR. For example, when the first data MDATA1 stored in the first memory register MR1 is the same data as the repair data REP_DATA, and thus the control circuit 450 enables the first memory comparison signal MCMP1 for the first memory register MR1, the first memory register MR1 may disable the first memory enable signal MEN1.

In the soft repair mode, when a write command WT is inputted, the repair data REP_DATA may be stored in one of the system registers SR1 to SR4 (e.g., SR4).

Through the hard repair mode, the boot-up operation, and the soft repair mode as described above, the memory device may deactivate one of the memory registers MR1 to MR4 storing the same data as the soft repair data while storing the soft repair data in one of the system registers SR1 to SR4.

In the normal mode, the memory device may access a memory cell corresponding to the normal input address ADD Inputted together with an access command (e.g., an active command, a read command, or a write command). During the repair operation in the normal mode, the memory device may enable one of the memory and system comparison signals MCMP1 to MCMP4 and SCMP1 to SCMP4 (e.g., SCMP4) corresponding to one of the memory and system registers MR1 to MR4 and SR1 to SR4 (e.g., SR4) that stores the same data as the normal input address ADD, and access a corresponding redundancy cell based on the enabled one among the memory and system comparison signals MCMP1 to MCMP4 and SCMP1 to SCMP4.

During the repair operation in the normal mode, although one of the memory registers MR1 to MR4 (e.g., MR1) stores the same data as the normal input address ADD, the register storing the normal input address ADD is already deactivated in the soft repair mode. Therefore, the corresponding comparison signal (e.g., MCMP1) for the deactivated memory register (e.g., MR1) may not be enabled by the control signal 450 when comparing the normal input address ADD with the memory comparison signals MCMP1 to MCMP4 for the memory registers MR1 to MR4 for the repair operation.

As a result, during the repair operation in the normal mode, the redundancy cells corresponding to the comparison signal (e.g., MCMP1) for the memory register (e.g., MR1) storing the normal input address ADD in the hard repair mode and the boot-up operation and the comparison signal (e.g., SCMP4) for the system register (e.g., SR4) storing the normal input address ADD in the soft repair mode are not accessed at the same time even though the deactivated memory register (e.g., MR1) and the activated system register (e.g., SR4) store the same repair data or the same normal input address ADD as each other. In the embodiment shown in FIG. 3, two word lines are not activated simultaneously.

Although FIG. 4 illustrates a circuit where the register storing the same data as the soft repair data is deactivated, a similar effect may also be obtained when the repair data (i.e., failure address) stored in the register storing the same data as the soft repair data is erased and the corresponding enable signal is disabled.

Figure 5:
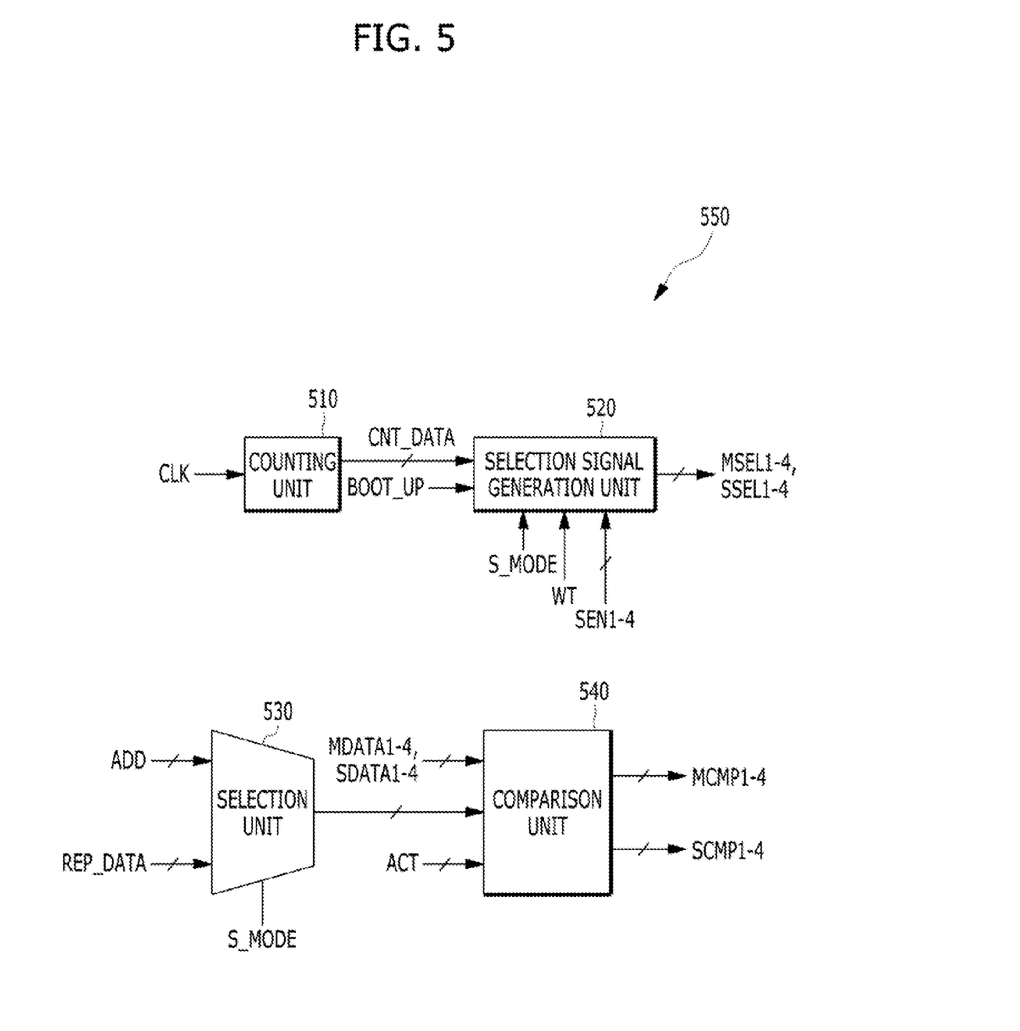
FIG. 5 is a block view illustrating a control circuit shown in FIG. 4.

FIG. 5 is a block view illustrating the control circuit 450.

Referring to FIG. 5, the control circuit 450 may include a counting unit 510, a selection signal generation unit 520, a selection unit 530, and a comparison unit 540.

The non-volatile memory circuit 440 may transmit a clock CLK along with the hard repair data M_HADD and S_HADD during a boot-up operation. The clock CLK may be a signal that is enabled and toggles in a boot-up operation section. The counting unit 510 may count the number of times that the clock CLK toggles and generate counting data CNT_DATA.

The selection signal generation unit 520 may sequentially enable the memory and system selection signals MSEL1 to MSEL4 and SSEL1 to SSEL4 by using the counting data CNT_DATA in a section where a boot-up signal BOOT_UP is enabled. For example, the selection signal generation unit 520 enables a selection signal MSEL1 first and then enables other selection signals whenever the value of the counting data CNT_DATA is increased by '1'. In this way, the selection signal generation unit 520 may sequentially enable the memory and system selection signals MSEL1 to MSEL4 and SSEL1 to SSEL4 from the selection signal MSEL1 to the selection signal MSEL4.

Also, when a write command WT is inputted in the soft repair mode while the soft repair mode signal S_MODE is enabled, the selection signal generation unit 520 may enable a selection signal corresponding to a disabled enable signal among the system enable signals SEN1 to SEN4 corresponding to the system registers SR1 to SR4.

During the repair operation in the normal mode when the soft repair mode signal S_MODE is disabled, the selection unit 530 may select the inputted normal input address ADD and transmit it to the comparison unit 540. In the soft repair mode when the soft repair mode signal S_MODE is enabled, the selection unit 530 may transmit the received repair data REP_DATA to the comparison unit 540.

When an active command ACT is inputted, the comparison unit 540 may compare the data MDATA1 to MDATA4 and SDATA1 to SDATA4 stored in the memory and system registers MR1 to MR4 and SR1 to SR4 with the output of the selection unit 530 and generate the memory and system comparison signals MCMP1 to MCMP4 and SCMP1 to SCMP4. The comparison unit 540 may disable the comparison signal corresponding to the register storing the same data as the output of the selection unit 530.

Figure 6:
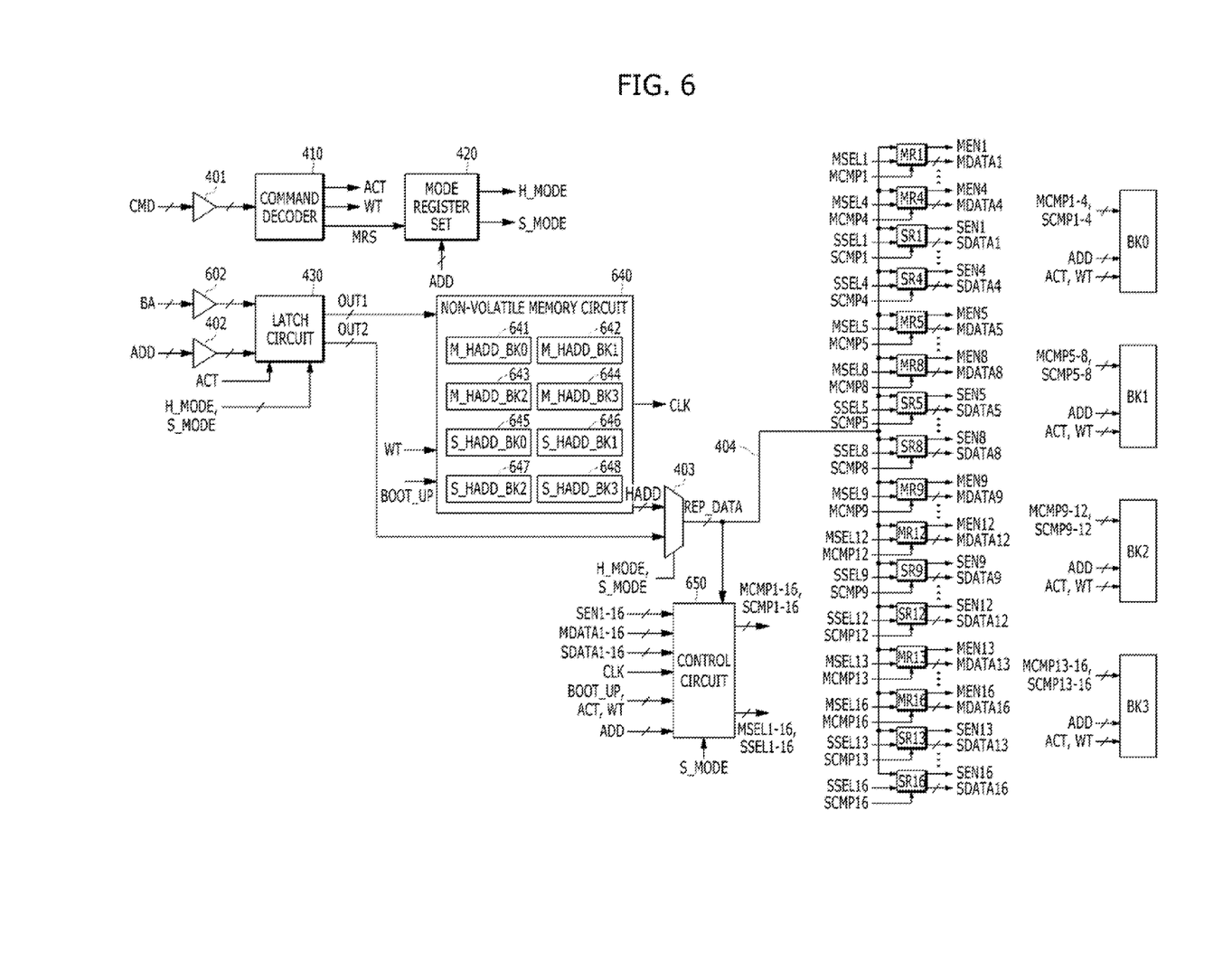
FIG. 6 is a block view illustrating a memory device in accordance with another embodiment of the present invention.

FIG. 6 is a block view illustrating a memory device in accordance with another embodiment of the present invention. FIG. 6 shows a memory device including a plurality of memory banks BK0 to BK3.

Referring to FIG. 6, the memory device may include the command receiver 401, a bank address receiver 602, the address receiver 402, the selector 403, the data bus 404, the command decoder 410, the mode register set 420, the latch circuit 430, a non-volatile memory circuit 640, a control circuit 650, a plurality of memory and system registers MR1 to MR16 and SR1 to SR16, and a plurality of memory banks BK0 to BK3.

The command receiver 401, the address receiver 402, the selector 403, the data bus 404, the command decoder 410, the mode register set 420, and the latch circuit 430 are described above with reference to FIGS. 4 and 5.

The bank address receiver 602 may receive a bank address BA, which is a multi-bit signal inputted from outside of the memory device, for selecting one of the memory banks BK0 to BK3. A normal input address ADD may select one of the memory cells in the selected memory bank. The bank address BA may be inputted simultaneously with the normal input address ADD.

The non-volatile memory circuit 640 may include memory regions 641 to 644 and system regions 645 to 648. The memory regions 641 to 644 may correspond one-on-one with the memory banks BK0 to BK3, and the system regions 645 to 648 may correspond one-to-one with the memory banks BK0 to BK3 as well. The non-volatile memory circuit 640 is basically the same as the non-volatile memory circuit 440 described with reference to FIG. 4 except for the memory and system regions.

The memory regions 641 to 644 may store memory hard repair data M_HADD_BK0 to M_HADD_BK3 of the memory banks BK0 to BK3. The memory hard repair data M_HADD_BK0 to M_HADD_BK3 stored in the memory regions 641 to 644 may be programmed by the manufacturer of the memory device.

The system regions 645 to 648 of the non-volatile memory circuit 640 may store system hard repair data S_HADD_BK0 to S_HADD_BK3 of the memory banks BK0 to BK3. The bank address BA and the normal input address ADD may be applied to the memory device from outside of the memory device in the hard repair mode.

When the write command WT is enabled in the hard repair mode, the non-volatile memory circuit 640 receives the hard repair address signal OUT1 of the latch circuit 430 and may program it in one of the system regions 645 to 648 selected on the basis of the bank address BA. The hard repair address signal OUT1 may be the system hard repair data S_HADD that is transmitted from outside of the memory device in the form of the input address ADD, that is, it o10 may be a failure address representing a memory cell that needs to be repaired in the memory bank BK represented by the bank address BA. In other words, when the system regions 645 to 648 are programmed, the bank address BA is used to select one among the system regions 645 to 648, and the normal input address ADD may be programmed in the selected system region as the system hard repair data S_HADD.

When a boot-up signal BOOT_UP is enabled, the memory hard repair data M_HADD_BK0 to M_HADD_BK3 stored in the memory regions 641 to 644 of the non-volatile memory circuit 640 are transmitted to the memory registers MR1 to MR16, and the system hard repair data S_HADD_BK0 to S_HADD_BK3 stored in the system regions 645 to 648 of the non-volatile memory circuit 640 are transmitted to the system registers SR1 to SR16. The hard repair data are transmitted as the hard repair data HADD in the order of the memory hard repair data followed by the system hard repair data in each memory bank and, overall, they may be transmitted in the order of the memory banks. For example, the hard repair data are transmitted in the order of MR1 to MR4 and SR1 to SR4 for each memory bank, e.g., a memory bank BK0, and the hard repair data may be transmitted in the order of BK0 to BK3, overall.

The memory and system registers MR1 to MR16 and SR1 to SR16 may store repair data of corresponding memory banks. The memory registers MR1 to MR4 may store the memory hard repair data M_HADD_BK0 corresponding to the memory bank BK0, and the system registers SR1 to SR4 may store the system hard repair data S_HADD_BK0 or the system repair data corresponding to the memory bank BK0. The memory registers MR5 to MR8 may store the memory hard repair data M_HADD_BK1 corresponding to the memory bank BK1, and the system registers SR5 to SR8 may store the system hard repair data S_HADD_BK1 or the system repair data corresponding to the memory bank BK1. The memory registers MR9 to MR12 may store the memory hard repair data M_HADD_BK2 corresponding to the memory bank BK2, and the system registers SR9 to SR12 may store the system hard repair data S_HADD_BK2 or the system repair data corresponding to the memory bank BK2. The memory registers MR13 to MR16 may store the memory hard repair data M_HADD_BK3 corresponding to the memory bank BK3, and the system registers SR13 to SR16 may store the system hard repair data S_HADD_BK3 or the system repair data corresponding to the memory bank BK3.

Each of the memory and system registers MR1 to MR16 and SR1 to SR16 may perform the same operation as described above with reference to FIG. 4. Each of memory and system selection signals MSEL1 to MSEL16 and SSEL1 to SSEL16, each of memory and system comparison signals MCMP1 to MCMP16 and SCMP1 to SCMP16, each of the memory and system enable signals MEN1 to MEN16 and SEN1 to SEN16, and each of the data MDATA1 to MDATA16 and SDATA1 to SDATA16 stored in the memory and system registers MR1 to MR16 and SR1 to SR16 may be the same as described with reference to FIG. 4.

The memory and system registers MR1 to MR16 and SR1 to SR16 are deactivated when they are empty. When the memory and system registers MR1 to MR16 and SR1 to SR16 store repair data, they may be activated. When the memory and system registers MR1 to MR16 and SR1 to SR16 are activated, they may enable corresponding enable signals MEN1 to MEN16 and SEN1 to SEN16. The memory and system registers MR1 to MR16 and SR1 to SR16 may receive and store hard repair data for the corresponding banks.

During the boot-up operation, the control circuit 650 may sequentially select the memory and system registers MR1 to MR16 and SR1 to SR16. To be specific, during the boot-up operation, the control circuit 650 may select the registers in the order of the memory registers followed by the system registers in each memory bank, and select them in the order of the memory banks, overall. In the soft repair mode after completion of the boot-up operation, the control circuit 650 may select one among the system registers SR1 to SR16, which is empty, corresponding to the memory banks designated by the bank address BA. The repair data REP_DATA transmitted through the data bus 404 during the boot-up operation and in the soft repair mode may be stored in the memory and system registers MR1 to MR16 and SR1 to SR16 selected by the control circuit 650.

The control circuit 650 may deactivate the registers storing the same data among the registers corresponding to the memory bank designated by the bank address BA of the repair data REP_DATA in the soft repair mode. To this end, in the soft repair mode, the control circuit 650 may generate the memory and system comparison signals MCMP1 to MCMP16 and SCMP1 to SCMP16 by comparing the repair data REP_DATA with the data MDATA1 to MDATA16 and SDATA1 to SDATA16 of the memory and system registers MR1 to MR16 and SR1 to SR16. For example, when the bank address BA of the repair data REP_DATA corresponds to the memory bank BK0, the control circuit 650 may deactivate the registers storing the same data in the normal input address ADD of the repair data REP_DATA among the memory and system registers MR1 to MR4 and SR1 to SR4.

Also, the control circuit 650 may control the repair operation in the normal mode to access a redundancy cell that substitutes for a failure cell corresponding to the input address ADD in the memory bank designated by the bank address BA. To this end, during the repair operation in the normal mode, the control circuit 650 may generate the memory and system comparison signals MCMP1 to MCMP16 and SCMP1 to SCMP16 by comparing the input address ADD with the data MDATA1 to MDATA16 and SDATA1 to SDATA16 of the memory and system registers MR1 to MR16 and SR1 to SR16 for the corresponding memory bank designated by the bank address BA.

For example, in the soft repair mode, when the memory bank BK0 is designated by the bank address BA included in the repair data REP_DATA, the control circuit 650 may compare the normal input address ADD of the repair data REP_DATA with the data MDATA1 to MDATA4 and SDATA1 to SDATA4 of the memory and system registers MR1 to MR4 and SR1 to SR4. Also, during the repair operation in the normal mode, when the memory bank BK0 is designated by the bank address BA, the control circuit 650 may compare the normal input address ADD with the data MDATA1 to MDATA4 and SDATA1 to SDATA4. The control circuit 650 may generate a plurality of memory and system comparison signals MCMP1 to MCMP16 and SCMP1 to SCMP16 based on the comparison result.

To be more specific, the control circuit 650 generates selection signals MSEL1 to MSEL16 and SSEL1 to SSEL16 corresponding to the registers MR1 to MR16 and SR1 to SR16 while sequentially enabling the selection signals from 'MSEL1' during a boot-up operation. In a soft repair mode, the control circuit 650 may enable one of the system selection signals SSEL1 to SSEL16 corresponding to one of the system registers SR1 to SR16 that is empty, for the corresponding memory bank designated by the bank address BA included in the repair data REP_DATA. As described above, with reference to FIG. 4, the memory and system enable signals MEN1 to MEN16 and SEN1 to SEN16 may be enabled when the hard repair data HADD and the soft repair data ADD is stored in the corresponding one of the memory and system registers MR1 to MR16 and SR1 to SR16 and, otherwise, the memory and system enable signals MEN1 to MEN16 and SEN1 to SEN16 may be disabled.

In the soft repair mode, when the active command ACT is enabled, the control circuit 650 may enable one of the memory comparison signals MCMP1 to MCMP16 corresponding to one of the memory registers MR1 to MR16 storing the same data as the repair data REP_DATA through a comparison operation of the repair data REP_DATA with the data MDATA1 to MDATA16 of the memory registers MR1 to MR16 corresponding to the memory bank designated by the bank address BA. One of the memory registers MR1 to MR16 corresponding to the enabled one of the memory comparison signals MCMP1 to MCMP16 may be deactivated.

During the repair operation in the normal mode, the control circuit 650 may enable one among the memory and system comparison signals MCMP1 to MCMP16 and SCMP1 to SCMP16 corresponding to one of the memory and system registers MR1 to MR16 and SR1 to SR16 that stores the same data as the normal input address ADD. The memory and system comparison signals MCMP1 to MCMP16 and SCMP1 to SCMP16 may be inputted into the corresponding memory bank BK designated by the bank address BA.

Each of the memory banks BK0 to BK3 receive the corresponding memory and system comparison signals MCMP1 to MCMP16 and SCMP1 to SCMP16 and perform the repair operation in the normal mode. To be specific, when designated by the bank address BA, the memory banks BK0 to BK3 access a part (e.g., memory cells) corresponding to the normal input address ADD, but when a comparison signal is enabled, the memory banks BK0 to BK3 may access the part (e.g., redundancy cells) designated by the enabled comparison signal.

During the repair operation in the normal mode of each of the memory banks BK0 to BK3, although one of the memory registers MR1 to MR16 (e.g., MR1) stores the same data as the normal input address ADD, the register storing the normal input address ADD is already deactivated in the soft repair mode. Therefore, the corresponding comparison signal (e.g., MCMP1) for the deactivated memory register (e.g., MR1) may not be enabled by the control signal 650 when comparing the input address ADD with the memory comparison signals MCMP1 to MCMP16 for the memory registers MR1 to MR16 for the repair operation.

As a result, during the repair operation in the normal mode of each of the memory banks BK0 to BK3, the redundancy cells corresponding to the comparison signal (e.g., MCMP1) for the memory register (e.g., MR1) storing the normal input address ADD in the hard repair mode and the boot-up operation and the comparison signal (e.g., SCMP4) for the system register (e.g., SR4) storing the input address ADD in the soft repair mode are not accessed at the same time even though the deactivated memory register (e.g., MR1) and the activated system register (e.g., SR4) store the same repair data or the same normal input address ADD as each other. In the embodiment shown in FIG. 6, two word lines are not activated simultaneously.

Figure 7:
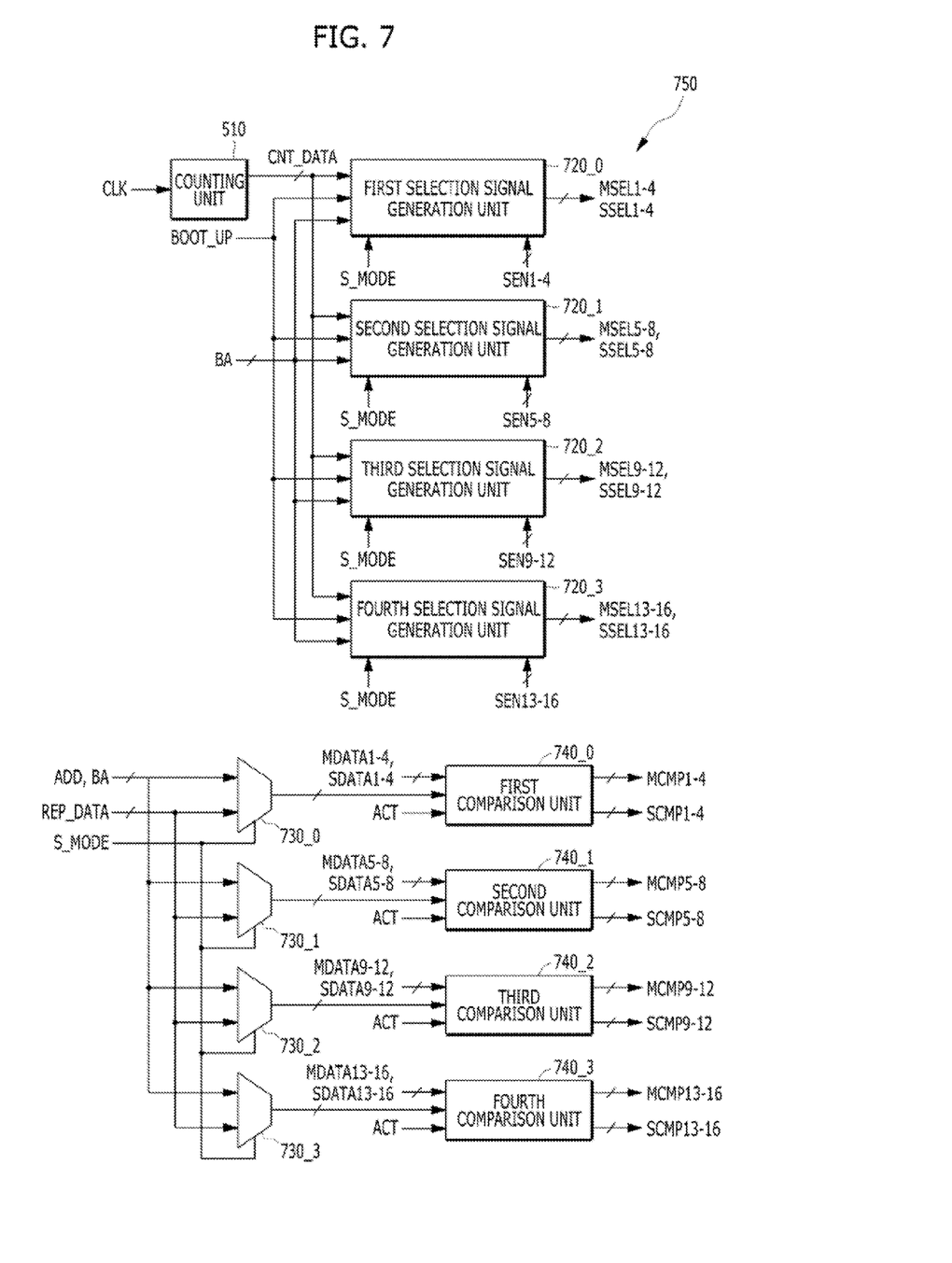
FIG. 7 is a block view illustrating a control circuit shown in FIG. 6.

FIG. 7 is a block view illustrating a control circuit 650.

Referring to FIG. 7, the control circuit 650 may include a counting unit 510, plural selection signal generation units 720_0 to 720_3, plural selection units 730_0 to 730_3, and plural comparison units 740_0 to 740_3.

The non-volatile memory circuit 640 may transmit a clock CLK along with repair data M_HADD_BK0 and S_HADD_BK0 to M_HADD_BK3 and S_HADD_BK3 during a boot-up operation. The clock CLK may be a signal that is enabled and toggles in a boot-up operation section. The counting unit 510 may count the number of times that the clock CLK toggles and generate counting data CNT_DATA.

The plural selection signal generation units 720_0 to 720_3 may sequentially enable the selection signals MSEL1 to MSEL16 and SSEL1 to SSEL16 of the corresponding registers by using the counting data CNT_DATA in a section where a boot-up signal BOOT_UP is enabled. The plural selection signal generation units 720_0 to 720_3 may sequentially enable the corresponding selection signals. For example, the plural selection signal generation units 720_0 to 720_3 may sequentially enable the selection signals, from the selection signal MSEL1 to the selection signal SSEL16, whenever the value of the counting data CNT_DATA is increased by a predetermined value. In other words, the selection signals may be enabled in the order of MSEL1 to MSEL4 and SSEL1 to SSEL4, MSEL5 to MSEL8 and SSEL5 to SSEL8, MSEL9 to MSEL12 and SSEL9 to SSEL12, and MSEL13 to MSEL16 and SSEL13 to SSEL16.

When a corresponding memory bank is designated by the bank address BA of the data REP_DATA and a write command WT is inputted in the soft repair mode while the soft repair mode signal S_MODE is enabled, the plural selection signal generation units 720_0 to 720_3 may enable a selection signal corresponding to a deactivated system register among the system enable signals SEN1 to SEN16 corresponding to the system registers of the designated memory bank. For example, when the memory bank BK0 is designated by the bank address BA, one of the system selection signals SSEL1 to SSEL16 corresponding to the disabled enable signals among the system enable signals SEN1 to SEN16 may be enabled.

During the repair operation in the normal mode when the soft repair mode signal S_MODE is disabled, the plural selection units 730_0 to 730_3 may select and transmit the inputted bank address BA and normal input address ADD to the corresponding comparison units 740_0 to 740_3. In the soft repair mode, when the soft repair mode signal S_MODE is enabled, the plural selection units 730_0 to 730_3 may receive and transmit the repair data REP_DATA to the corresponding comparison units 740_0 to 740_3.

When a memory bank is designated by the bank address BA and an active command ACT is inputted, the plural comparison units 740_0 to 740_3 may compare the data MDATA1 to MDATA16 and SDATA1 to SDATA16 stored in the corresponding registers with the output of the corresponding selection units 730_0 to 730_3 and generate memory and system comparison signals MCMP1 to MCMP16 and SCMP1 to SCMP16. The plural comparison units 740_0 to 740_3 may enable the comparison signal corresponding to the register storing the same data as the output of the corresponding plural selection units 730_0 to 730_3.

Figure 8:
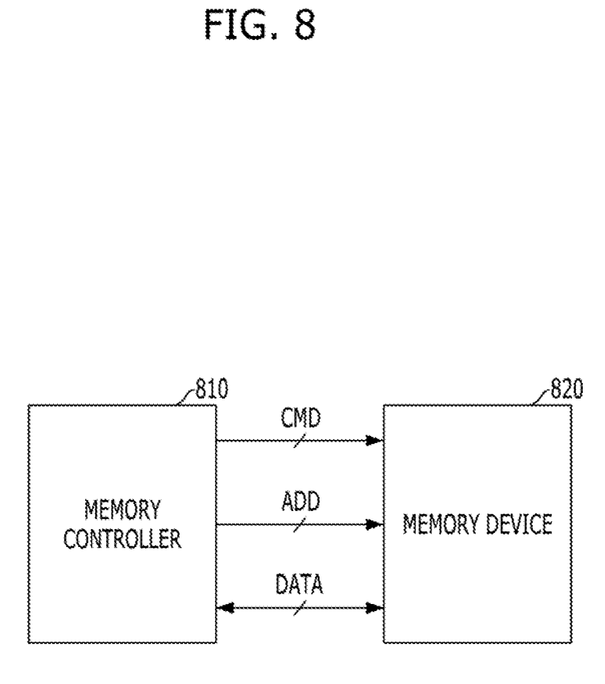
FIG. 8 is a block view illustrating a memory system in accordance with an embodiment of the present invention.

FIG. 8 is a block view illustrating a memory system in accordance with an embodiment of the present invention.

Referring to FIG. 8, the memory system may include a memory controller 810 and a memory device 820.

The memory controller 810 may control the operation of the memory device 820 by transmitting a command CMD and a normal input address ADD to the memory device 820, and transmit and receive data DATA to and from the memory device 820 during a read operation and/or a write operation. The memory device 820 may be set to a repair operation mode as the memory controller 810 transmits a command CMD and a normal input address ADD to the memory device 820. Also, an active command or a write command is applied to the memory device 820 as the memory controller 810 transmits a command CMD. The memory device 820 may be the memory device shown in FIG. 4 or the memory device shown in FIG. 6. When the memory device 820 is the memory device shown in FIG. 4, the normal input address ADD transmitted from the memory controller 810 may include a normal address alone, and when the memory device 820 is the memory device shown in FIG. 6, the normal input address ADD transmitted from the memory controller 810 may include a bank address and a normal address.

The memory device 820 shown in FIGS. 4 and 6 may receive the command CMD and the normal input address ADD, and set the repair mode. When the memory device 820 is set to a hard repair mode, the memory device 820 may program an address applied from the memory controller 810 in a non-volatile memory circuit in response to an active command and a write command that are applied from the memory controller 810 in the form of the command CMD. Also, when the memory device 820 is set to a soft repair mode, the memory device 820 may store an address applied from the memory controller 810 in a system register in response to an active command and a write command that are applied from the memory controller 810 in the form of the command CMD. The register storing the same address as the applied address may be deactivated using the method described above with reference to FIGS. 4 and 6.

When an active command, a read command, or a write command is applied from the memory controller 810 during a normal operation, the memory device 820 may perform a repair operation based on repair data stored in a register. As described above, the memory device 820 may prevent different parts of the memory device 820 from being simultaneously accessed during a repair operation by deactivating a register storing the same data as the soft repair data.

Although FIGS. 4 to 7 illustrate an embodiment where each memory bank includes four memory registers and four system registers, and where a memory device includes four memory banks, the number of registers memory banks may be designed to be any integer equal to or greater than '1'.

According to an embodiment of the present invention, it is possible to prevent errors that may be caused by the same repair data being stored in the registers of a memory device or a memory system by deactivating the register storing the same hard repair data as soft repair data when the soft repair data is stored in the registers.

While the present invention has been described with respect to specific embodiments, it will be apparent to those skilled in the art that various changes and modifications may be made without departing from the spirit and scope of the invention as defined in the following claims.

What is claimed is:

1. A memory device, comprising:
   a non-volatile memory circuit configure to store hard repair data;
   a data bus configure to transmit the hard repair data during a boot-up operation, and transmitting soft repair data during a soft repair mode;
   a plurality of registers configure to store repair data transmitted through the data bus and activated when the transmitted repair data is stored;
   a control circuit configure to select a register to store the transmitted repair data among the plurality of the registers, and during the soft repair mode, deactivating a register that stores the same data as the transmitted repair data; and
   a memory bank configure to perform a repair operation based on the data stored in a register that is activated among the plurality of the registers.

2. The memory device of claim 1,
   wherein the control circuit sequentially selects the plurality of the registers during the boot-up operation, and
   wherein, during the soft repair mode, the control circuit selects a register that does not store data after the boot-up operation is completed.

3. The memory device of claim 1,
   wherein the control circuit compares the transmitted repair data with the data stored in the plurality of the registers during the soft repair mode, and
   wherein the control circuit compares an external address inputted from an exterior of the memory device with the data stored in the plurality of the registers during the repair operation.

4. The memory device of claim 1, wherein, in the soft repair mode, the control circuit deactivates a register storing the same data as the transmitted repair data in response to an active command, and stores the transmitted repair data in a selected register among the plurality of the registers in response to a write command.

5. The memory device of claim 1, wherein the non-volatile memory circuit includes one-time programmable memory cells in which data are not changed once the data are stored.

6. The memory device of claim 1, wherein the data stored in the non-volatile memory circuit are retained permanently, and the data stored in the plurality of the registers are erased when the memory device is turned off.

7. The memory device of claim 1,
   wherein the hard repair data includes memory hard repair data, which is repair data programmed when the memory device is fabricated, and system hard repair data, which is repair data transmitted from a memory controller to the memory device, and
   wherein the soft repair data is repair data transmitted from the memory controller to the memory device.

8. The memory device of claim 7, wherein the plurality of the registers include:
   one or more memory registers for storing the memory hard repair data; and
   one or more system registers for storing the system hard repair data or the soft repair data.

9. A memory device, comprising: a non-volatile memory circuit including memory regions for storing memory hard repair data of memory banks and system regions for storing system hard repair data of the memory banks;
   a data bus configure to transmit the memory hard repair data and the system hard repair data during a boot-up operation, and transmitting soft repair data during a soft repair mode;
   registers configure to store data of a corresponding memory bank among the repair data transmitted through the data bus and activating when the transmitted repair data are stored;
   a control circuit configure to select a register to store the transmitted repair data among the registers, and during the soft repair mode, deactivating a register that stores the same data as the transmitted repair data among the registers corresponding to a memory bank corresponding to the transmitted repair data; and
   memory banks configure to perform a repair operation based on the data stored in activated registers.

10. The memory device of claim 9,
    wherein the control circuit sequentially selects the registers during the boot-up operation, and
    wherein, during the soft repair mode, the control circuit selects a register that does not store data after the boot-up operation is completed among the registers corresponding to the transmitted repair data.

11. The memory device of claim 9,
    wherein the control circuit compares the transmitted repair data with the data stored in the registers corresponding to a memory bank corresponding to the transmitted repair data during the soft repair mode, and
    wherein the control circuit compares an external address inputted from an exterior of the memory device with the data stored in the registers corresponding to a memory bank designated by the inputted address during the repair operation.

12. The memory device of claim 9, wherein the data stored in the non-volatile memory circuit are retained permanently, and the data stored in the registers are erased when the memory device is turned off.

13. The memory device of claim 9,
    wherein the memory hard repair data is repair data programmed when the memory device is fabricated, and
    wherein the system hard repair data and the soft repair data are repair data transmitted from a memory controller to the memory device.

14. The memory device of claim 13, wherein the registers include:
    one or more memory registers for storing the memory hard repair data; and
    one or more system registers for storing the system hard repair data or the soft repair data.

15. The memory device of claim 9, wherein the non-volatile memory circuit includes one-time programmable memory cells in which data are not changed once the data are stored.

16. The memory device of claim 9,
    wherein, when a bank address and a normal address are inputted in a hard repair mode, the normal address is programmed in a system region selected based on the bank address among the system regions, and
    wherein, when the bank address and the normal address are inputted in a soft repair mode, the normal address is programmed in the registers corresponding to a memory bank designated by the bank address among the registers.

17. The memory device of claim 9, wherein the memory regions include first to $N^{th}$ memory regions, wherein the system regions include first to N$^{th}$ system regions, wherein the registers include first to N$^{th}$ registers, wherein the memory banks include first to N$^{th}$ memory banks,
   wherein the first to N$^{th}$ the memory banks correspond to the first to N$^{th}$ memory regions, the first to N$^{th}$ system regions and the first to N$^{th}$ registers, respectively.

18. A memory system, comprising:
   a memory device that comprises:
   a non-volatile memory circuit;
   memory banks,
   wherein the memory device programs system hard repair data inputted in a hard repair mode in the non-volatile memory circuit and performs a repair operation based on the repair data stored in the non-volatile memory circuit and soft repair data inputted in a soft repair mode; and
   a memory controller configure to set up the memory device in the hard repair mode or the soft repair mode, inputting the system hard repair data into the memory device in the hard repair mode, and inputting the soft repair data into the memory device in the soft repair mode, wherein the memory device further comprises:
   a data bus that transmits, memory hard repair data and the system hard repair data during a boot-up operation, and transmits the soft repair data during a soft repair mode;
   registers that store data of a corresponding memory bank among the repair data transmitted through the data bus, the registers being activated when the transmitted repair data are stored; and
   a control circuit that selects a register to store the transmitted repair data among the registers, and during the soft repair mode,
   deactivates a register storing the same data as the transmitted repair data among the registers corresponding to a memory bank corresponding to the transmitted repair data.

19. The memory system of claim 18, wherein the memory device performs repair operations of the memory banks based on the data stored in the activated register among the registers.

20. The memory system of claim 18, wherein the memory hard repair data is programmed when the memory device is fabricated.

21. The memory system of claim 18, wherein the non-volatile memory circuit includes one-time programmable memory cells in which data are not changed once the data are stored.

22. The memory system of claim 18, wherein the memory device further comprises:
   registers suitable for storing hard repair data including the system hard repair data and the soft repair data, wherein each of the registers is activated when one of the hard repair data and the soft repair data is stored therein;
   a control circuit suitable for control the registers to store the hard repair data during a boot-up operation, and to store the soft repair data in a soft repair mode, wherein the control circuit in the soft repair mode deactivates one or more hard repair registers of the registers storing the hard repair data, which is the same as the soft repair data; and
   a memory bank suitable for performing a repair operation based on the hard repair data and the soft repair data stored in activated registers of the registers.

23. The memory system of claim 22, wherein, in the soft repair mode, the control circuit controls one or more soft repair registers of the registers, which are empty after the boot-up operation, to store the soft repair data.

24. The memory system of claim 23, wherein, in the soft repair mode, the control circuit deactivates the hard repair registers in response to an active command, and controls the soft repair registers to store the soft repair data in response to a write command.

25. The memory system of claim 22, wherein the registers are initialized when the memory device is turned off.

26. The memory system of claim 22,
   wherein the hard repair data is permanently stored in the memory system in fabrication, and
   wherein the soft repair data is temporarily stored in the memory device in operation.

27. A memory device, comprising: registers configure to store hard repair data and soft repair data, wherein each of the registers is activated when one of the hard repair data and the soft repair data is stored therein;
   a control circuit configure to control the registers to store the hard repair data during a boot-up operation, and to store the soft repair data in a soft repair mode, wherein the control circuit in the soft repair mode deactivates one or more hard repair registers of the registers storing the hard repair data, which is the same as the soft repair data; and
   a memory bank configure to perform a repair operation based on the hard repair data and the soft repair data stored in activated registers of the registers.

28. The memory device of claim 27, wherein, in the soft repair mode, the control circuit controls one or more soft repair registers of the registers, which are empty after the boot-up operation, to store the soft repair data.

29. The memory device of claim 28, wherein, in the soft repair mode, the control circuit deactivates the hard repair registers in response to an active command, and controls the soft repair registers to store the soft repair data in response to a write command.

30. The memory device of claim 27, wherein the registers are initialized when the memory device is turned off.

31. The memory device of claim 27,
   wherein the hard repair data is permanently stored in the memory device in fabrication, and
   wherein the soft repair data is temporarily stored in the memory device in operation.

* * * * *